United States Patent [19]
Kinsman et al.

[11] Patent Number: 6,115,254
[45] Date of Patent: Sep. 5, 2000

[54] VERTICAL SURFACE MOUNT APPARATUS WITH THERMAL CARRIER

[75] Inventors: Larry D. Kinsman, Boise; Jerry M. Brooks, Caldwell; Walter L. Moden, Meridian, all of Id.

[73] Assignee: Micron Technology, Inc., Boise, Id.

[21] Appl. No.: 09/441,525

[22] Filed: Nov. 16, 1999

Related U.S. Application Data

[63] Continuation of application No. 09/060,562, Apr. 15, 1998.

[51] Int. Cl.[7] ........................................ H05K 7/20
[52] U.S. Cl. ...................... 361/704; 361/706; 361/707; 361/760; 361/772; 361/773; 361/825; 257/666; 257/690; 257/692; 257/696; 257/723; 174/16.3; 174/260; 174/261; 174/267; 165/80.3
[58] Field of Search ...................... 361/700–704, 361/706–707, 760–766, 769, 772–774, 777, 784–785, 736–737, 741, 748, 756, 825, 813; 257/666, 692, 696, 706–708, 721, 722, 723, 673, 676, 690, 730; 174/52.2, 260, 52.1, 16.3, 52.3; 437/208, 217, 220, 207

[56] References Cited

U.S. PATENT DOCUMENTS

| | | |
|---|---|---|
| Re. 34,794 | 11/1994 | Farnworth . |
| 4,054,901 | 10/1977 | Edwards et al. ........................ 357/81 |
| 5,041,005 | 8/1991 | McHugh . |
| 5,209,675 | 5/1993 | Korsunsky . |
| 5,244,403 | 9/1993 | Smith et al. . |
| 5,256,078 | 10/1993 | Lwee et al. . |
| 5,413,970 | 5/1995 | Russel . |
| 5,432,678 | 7/1995 | Russel et al. ........................ 437/208 |
| 5,557,504 | 9/1996 | Siegel et al. . |
| 5,572,457 | 11/1996 | Michael . |

*Primary Examiner*—Leo P. Picard
*Assistant Examiner*—Michael Datskovsky
*Attorney, Agent, or Firm*—Trask Britt

[57] ABSTRACT

A high density vertical surface mount package and thermal carrier therefor including a heat sink.

34 Claims, 2 Drawing Sheets

VERTICAL SURFACE MOUNT APPARATUS WITH THERMAL CARRIER

CROSS REFERENCE TO RELATED APPLICATION

This application is a continuation of application Ser. No. 09/060,562, filed Apr. 15, 1998, pending.

BACKGROUND OF THE INVENTION

1. Field of the Invention

The present invention relates generally to semiconductor mounting packages and heat dissipation. More specifically, the present invention relates to high density vertical surface mount packages and thermal carriers for the same. This patent application is co-pending with United States patent application Ser. No. 09/052,446, filed Mar. 31, 1998, of Larry D. Kinsman, Jerry M. Brooks, and Walter L. Moden, entitled LOCKING ASSEMBLY FOR SECURING SEMICONDUCTOR DEVICE TO CARRIER SUBSTRATE.

2. State of the Art

Integrated circuit semiconductor devices are fabricated on wafers of silicon or gallium arsenide in such a manner as to generate many discrete output semiconductor device chips. Each of these discrete semiconductor device chips forms an integrated circuit semiconductor device die that must be packaged in order to be utilized within a computer system. One type of package encapsulates the semiconductor device die in a plastic package and bonds the die to a die mounted paddle or lead frame that then attaches to the lead frame's strips. The lead frames are then connected to pads on the semiconductor device die with the unit being encapsulated in a suitable plastic. This plastic encapsulated semiconductor device chip then undergoes a trim and form operation that separates the interconnected packages on the lead frame strips into individual entities and bends the lead package. This is the traditional and most recognized form of packaged IC chip and utilizes a highly automated manufacturing technology.

Several types of IC packages that have found favor include a package having a dual-in-line metal lead package or DIP, which typically was through-hole soldered on the printed circuit board, a pin grid array (PGA) package, which included a plurality of under lead pins that would either be through-hole soldered or inserted in a receiving unit, and a ball grid array, which uses solder balls aligned in a contact array for soldering the package onto the surface of the printed circuit board. Additionally, a new type of dual-in-line lead design has been developed and is known as the small outline J-Lead package or SOJ package. The SOJ lead package has advantages over the standard DIP design. One advantage is that the leads of an SOJ package are soldered to only one side of the circuit board, thus leaving the other side of the board free for the mounting of additional SOJ packages. Another reason is that the leads are much less vulnerable to damage prior to board assembly; hence, there are fewer rejections.

The SOJ package has extended to include a zig-zag in-line ("ZIP") package. ZIP packages allow the package to be mounted vertically. Vertical packages have a narrower horizontal cross section than the horizontally attached DIP or SOJ or PGA packages. Because of this, vertical packages allow the distance between other vertical packages to be quite minimal compared to the horizontal packages.

In vertical packages, such as ZIP packages, all leads exit through the lower edge of the package. Since vertical packages that have a single edge must be held in place before solder reflow operation is performed when being attached to the printed circuit board, they have a limited appeal because of the difficulty in maintaining them in such a vertical position.

Solutions have been provided to position ZIP packaging vertically without the need for additional package support structure until the final attachment of the package to the circuit board during a solder reflow operation. One example of such a solution is illustrated in United States Patent Reissue 43,794, reissued Nov. 20, 1994.

Reissue Patent 43,794 is directed towards a semiconductor package having a gull-wing, zig-zag, inline-lead configuration and end-of-packaging anchoring devices. The anchoring devices allow the semiconductor package to be rigidly fixed to a circuit board such as that each lead is in compressible contact with its associated mounting pad on the board. The anchoring device includes anchoring pins having fish-hook type bars that lock against the other side of the board when the pegs are inserted through the holes. Further, the anchoring pins can be adhesively bonded in recesses provided in the circuit board. This type of arrangement has several disadvantages. One disadvantage is that the PC board or circuit board must include holes for receiving the anchoring devices. These holes may crack and cause the circuit board to split along such a fracture, thus ruining the board. Additionally, the anchoring devices are inflexible and they may fracture and break because of the bias tension placed on it against the circuit board, thus damaging the semiconductor package. Additionally, the anchoring devices must extend out from either side of the semiconductor mounting package, thus causing the anchoring devices to require additional spacing, which limits the number of packages that can be vertically mounted on the circuit board.

These vertical chip packages typically are made of plastic. Plastic, at certain thicknesses, is durable enough for the stress of the tension and flexing endured during installation and use on the PC board. Plastic, however, is a poor thermal conductor and can break easily if too much force is applied. The vertical chip packages are designed to carry complex processors that generate excess heat that must be removed. Also, multiple chip packages need good heat dissipation as well.

Accordingly, what is needed is a vertical ZIP package that has good thermal conduction as well as greater mounting strength than is otherwise possible through previous packaging designs.

SUMMARY OF THE INVENTION

The present invention comprises high density, vertical surface mount packages and thermal carriers for the same. The semiconductor device chip package assembly includes a heat sink connected thereto.

DETAILED DESCRIPTION OF THE INVENTION

Figure 1:
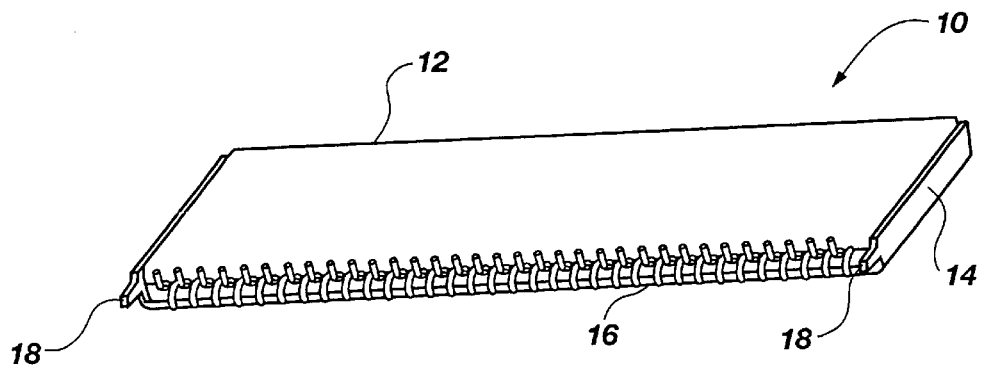
FIG. 1 is a perspective view of a vertical surface mount package having an improved thermal carrier device according to the present invention.

Referring to drawing FIG. 1, a perspective view of a vertical surface mount package (VSMP) assembly 10 including an improved thermal carrier is illustrated. Package assembly 10 includes a package 12, which is the encapsulated semiconductor device chip that is encapsulated according to techniques well known to those skilled in the art, and a thermal carrier device 14, which is mechanically attached to first package 12. Package 12 further includes a plurality of vertical, surface mount, gull-wing zig-zag package leads 16 extending therefrom which are connected to the semiconductor device chip therein.

Thermal carrier device 14 includes alignment leads 18, which insert into a printed circuit (PC) board (not shown). Thermal carrier device 14 functions as a heat sink and alignment leads 18 provide mechanical support during placement of package assembly 10 on the PC board for the solder reflow operation of connecting package leads 16 to the PC board. The thermal carrier device 14 helps channel heat from package assembly 10 to the PC board during operation or through thermal convection within the package assembly 10.

Figure 2:
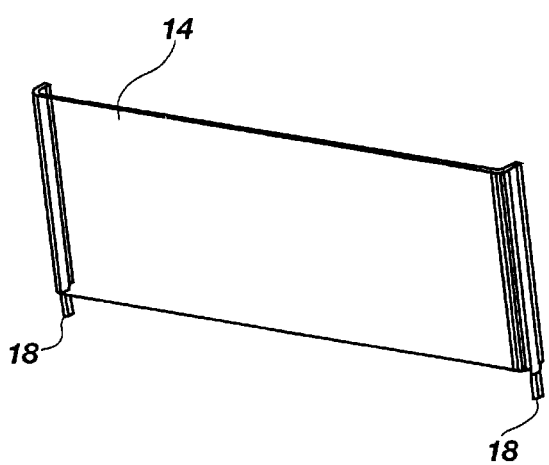
FIG. 2 depicts in perspective view the thermal carrier device of the vertical surface mount package of FIG. 1.

Drawing FIG. 2 depicts thermal carrier device 14 in a perspective view and includes alignment leads 18. Thermal carrier device 14, in one embodiment, uses a thermally conductive slug formed either from copper or aluminum or even a tin/lead plate alloy. Thermal carrier device 14 can include large DIP-style leads such as those shown as alignment leads 18, as well as the gull-wing type leads 16 connected to the semiconductor device chip. Any metal forming method can be used with one method being that used by the lead frame manufacturers in their etching or stamping of lead frames.

The carrier thickness can vary depending upon the amount of heat that package assembly 10 generates. In one embodiment, the thickness is about 10 mils. Further shown in drawing FIG. 2 is that alignment leads 18 have the sides bent to conform to the outer edges of package 12.

Thermal carrier device 14 can be attached to package 12 or to the lead frame (not shown). When thermal carrier device 14 is attached directly to package 12, thermal carrier device 14 would include alignment features that mate to inverse features molded on package 12. A suitable adhesive would then be applied to either package 12 or thermal carrier device 14, or both, and then the thermal carrier device mated together, followed by a cure stage, if required, by the adhesive used to join the two elements together.

When thermal carrier device 14 is attached to a lead frame, thermal carrier device 14 can be spot welded, adhesively attached, etc. to the die paddle thereof. The lead frame and attached thermal carrier device 14 can be processed through normal assembly techniques using conventional equipment. At encapsulation, it is preferred that thermal carrier device 14 be exposed to allow for convection cooling from contact with air after insertion into a PC board. If there is no die paddle in the lead frame, or if the slug is used as the die paddle, the thermal carrier device 14 can be attached to the lead frame such that it is not in electrical contact with the lead fingers of the lead frame. This is accomplished by adhesively attaching the thermal carrier device 14 to the lead fingers of the lead frame with a non-electrically conductive adhesive or attaching thermal carrier device 14 to the lead frame tie bar or rail.

Figure 3:
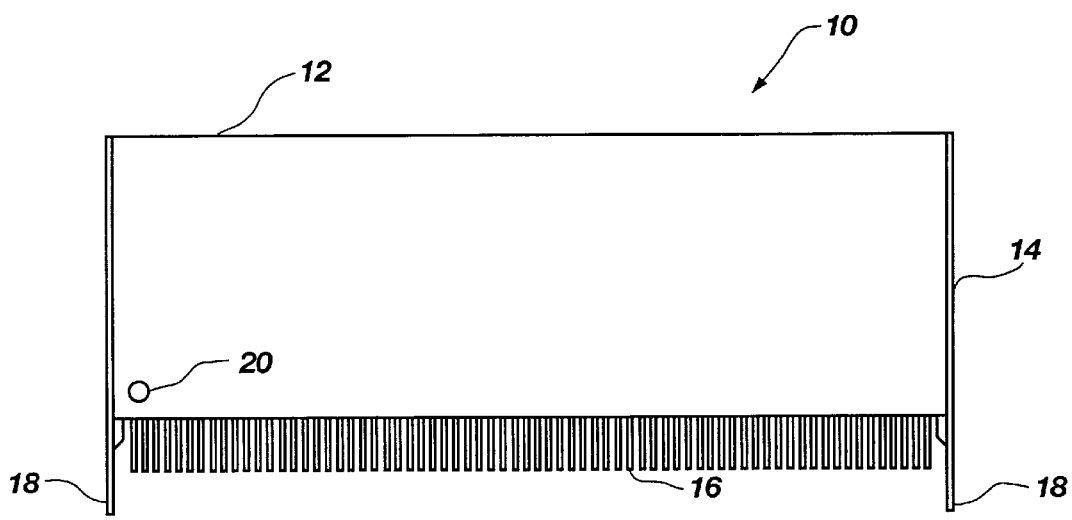
FIG. 3 is a front plan view of the vertical surface mount package of FIG. 1.

Referring to drawing FIG. 3 an alternative embodiment of package assembly 10 including chip package 12 attached to thermal carrier device 14, is illustrated. In this embodiment, the alignment leads 18 are slightly offset, as shown in the end view of drawing FIG. 4. Further, chip package 12 includes an identification mark 20, which signifies the lead 16 for attachment to the PC board.

Figure 4:
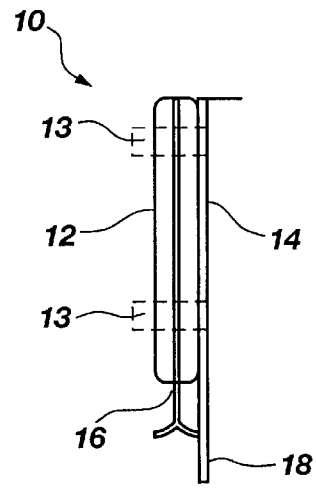
FIG. 4 is a side end view of the vertical surface mount package of FIG. 3.

As shown in drawing FIG. 4, the chip package 12 may be connected adhesively to the thermal carrier device 14, or attached by clips 13 (shown in phantom) to the thermal carrier device 14, or held by a press fit between the ends of the thermal carrier device 14, etc., by any suitable means.

Figure 5:
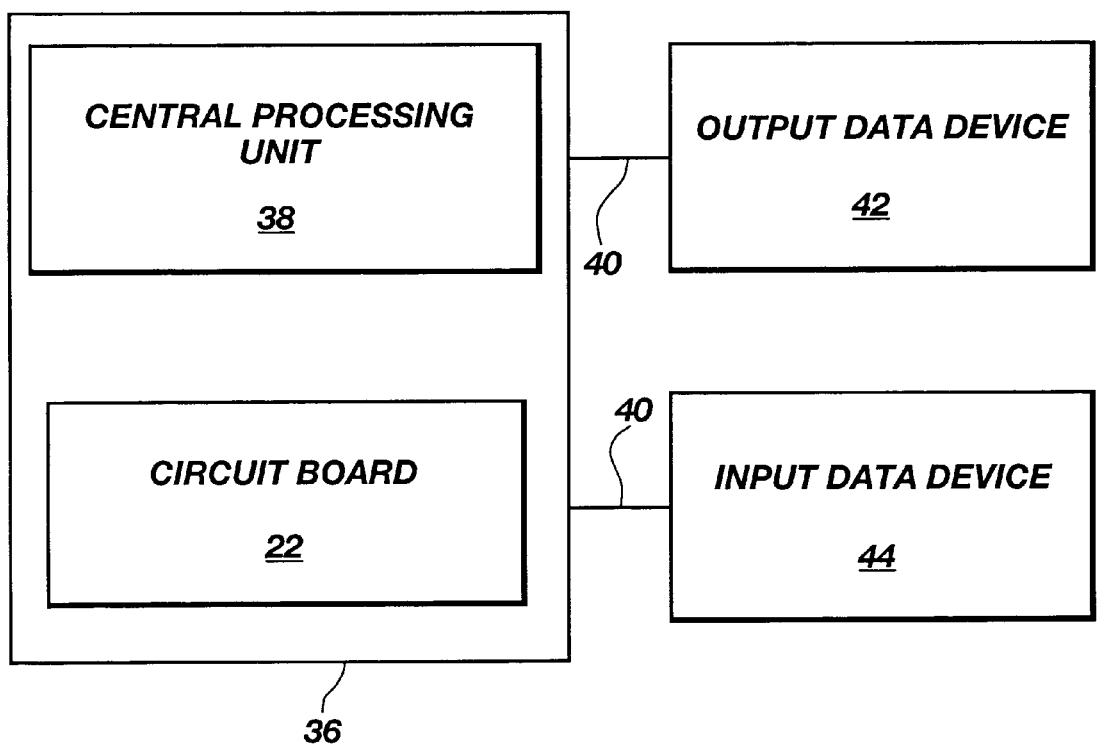
FIG. 5 is a block diagram of a computer system using the vertical surface mount package of FIG. 1.

Drawing FIG. 5 depicts in block diagram form a computer system 36 integrated with the IC package mounted to a circuit board 22. Circuit board 22 further includes a central processing unit 38, connected to a bus 40, which further communicates through output data device 42, such as a monitor, a printer, or an audio system, and input data device 44, such as a keyboard, a pointing device, or a scanner. Additional preferable structure for a computer system 36 would be readily apparent to those skilled in the art.

Prior vertical surface mount zig-zag packages lack an effective thermal management system. The thermal carrier device 14 provides an improved thermal management arrangement such that heat is either dissipated through a PC board or via convection to the surrounding air upon insertion. This allows for tighter densities to be achieved, as well as larger integrated circuits, such as larger micro processing units that are more sensitive to heat dissipation than memory devices. Further, prior attachment solutions required larger holes in the PC board, thus requiring larger areas for attachment. The alignment leads 18, used in insertion of the thermal carrier device 14, provide for tighter densities to be achieved as the leads are closely adjacent to the leads 16 that mount to the surface of the PC board, connecting the semiconductor device chip in package assembly 10 thereto. Additionally, problems have occurred where the leads 16 are molded into the semiconductor device chip package 12. These problems typically result in larger yield loss of defective package assemblies 10. The improved thermal carrier device 14 of the present package assembly 10 uses metal alignment leads 18 that are easier to manufacture and have less yield loss than the packaging typically associated with semiconductor device chip package 12.

Additional embodiments are possible with the concepts outlined in either drawing FIG. 1 or drawing FIG. 2, as well as in drawing FIG.'s 3 and 4. One example would be to mount package assemblies 10 on either side of the PC board 22 in such a fashion as to double the amount of surface mount vertical package connected to the PC board 22, as well as to add retainer clips to retain the surface mount vertical package connected to the PC board.

Other embodiments will become readily apparent to those skilled in the art. As such, any such changes in modifications that are apparent to those skilled in the art may be made thereto without departing from the spirit and the scope of the invention as claimed.

What is claimed is:

1. A semiconductor device chip package assembly for vertically mounting to a surface of a substrate, comprising:
    a chip package including an encapsulated semiconductor device, said chip package having a first surface, a second surface, a lead edge, a first end surface, a second end surface, and a plurality of lead pins extending along the lead edge for connecting to said surface of said substrate, said plurality of lead pins comprising gull-wing zig-zag lead pins connected to said encapsulated semiconductor device; and a thermal carrier device comprising a thermally conductive member having a pair of insert leads, one insert lead of said pair of insert leads connected to an end of the thermally conductive member extending therefrom for vertically mounting said thermal carrier device to said surface of said substrate, said pair of insert leads offset from said plurality of lead pins of said chip package mounted thereto, said thermal carrier device substantially conforming to a surface area of said first surface of said chip package, said thermal carrier device adhesively connected to said first surface of said chip package and connected by an interference fit by engaging portions of said pair of insert leads thereby providing a heat sink for said chip package.

2. The semiconductor device chip package assembly of claim 1, wherein the first surface and the second surface of the chip package have substantially the same surface area.

3. The semiconductor device chip package assembly of claim 1, wherein said thermal carrier device includes a first portion including one of said pair of insert leads and a second portion including another of said pair of insert leads, the first portion and the second portion of said thermal carrier device being located substantially adjacent the first end surface and the second end surface of the chip package.

4. The semiconductor device chip package assembly of claim 1, wherein said thermal carrier device is comprised of copper.

5. The semiconductor device chip package assembly of claim 1, wherein said thermal carrier device is comprised of aluminum.

6. The semiconductor device chip package assembly of claim 1, wherein a portion of said thermal carrier device is coated with a tin/lead alloy metal.

7. The semiconductor device chip package assembly of claim 1, wherein a portion of said thermal carrier device is coated with a nickel/palladium alloy metal.

8. The semiconductor device chip package assembly of claim 1, wherein a portion of said thermal carrier device is coated with a nickel/palladium/aluminum alloy metal.

9. The semiconductor device chip package assembly of claim 1, wherein a portion of said thermal carrier device is coated with a metal for soldering.

10. The semiconductor device chip package assembly of claim 1, wherein said thermal carrier device has a thickness in the range of 5 mils to about 12 mils.

11. The semiconductor device chip package assembly of claim 1, wherein said chip package includes a portion thereof made from epoxy.

12. A semiconductor device chip package assembly for vertically mounting to a surface of a substrate, comprising:

a chip package including an encapsulated semiconductor device, said chip package having a first surface, a second surface, a lead edge, a first end surface, a second end surface, and a plurality of lead pins extending along the lead edge for connecting to said surface of said substrate, the plurality of lead pins comprising gull-wing zig-zag lead pins, the first surface and the second surface of the chip package having substantially the same surface area; and a thermal carrier device substantially conforming to the surface area of said first surface of said chip package, said thermal carrier device including a pair of insert leads extending therefrom for substantially vertically mounting said thermal carrier device to said surface of said substrate, each insert lead of said pair of insert leads connected to an end of said thermal carrier device in substantial alignment with said plurality of lead pins of said chip package, said thermal carrier device adhesively connected to said first surface of said chip package and connected by an interference fit by engaging portions of said pair of insert leads thereby providing a heat sink for said chip package.

13. The semiconductor device chip package assembly of claim 12, wherein the first end surface and the second end surface of said chip package have substantially the same length and thickness.

14. The semiconductor device chip package assembly of claim 12, wherein said chip package is additionally connected to said thermal carrier device by a plurality of clips.

15. The semiconductor device chip package assembly of claim 12, wherein said thermal carrier device includes a first portion including one of said pair of insert leads and a second portion including another of said pair of insert leads, the first portion and the second portion of said thermal carrier device being located substantially adjacent the first end surface and the second end surface of the chip package.

16. The semiconductor device chip package assembly of claim 12, wherein said thermal carrier device is comprised of copper.

17. The semiconductor device chip package assembly of claim 12, wherein said thermal carrier device is comprised of aluminum.

18. The semiconductor device chip package assembly of claim 12, wherein a portion of said thermal carrier device is coated with a tin/lead alloy metal.

19. The semiconductor device chip package assembly of claim 12, wherein a portion of said thermal carrier device is coated with a nickel/palladium alloy metal.

20. The semiconductor device chip package assembly of claim 12, wherein a portion of said thermal carrier device is coated with a nickel/palladium/alumninum metal.

21. The semiconductor device chip package assembly of claim 12, wherein a portion of said thermal carrier device is coated with a metal for soldering.

22. The semiconductor device chip package assembly of claim 12, wherein said thermal carrier device has a thickness in the range of 5 mils to about 12 mils.

23. The semiconductor device chip package assembly of claim 12, wherein a portion of said chip package includes epoxy.

24. A method of forming a semiconductor device chip package assembly for vertically mounting to a surface of a substrate, comprising:

forming a chip package including an encapsulated semiconductor device, said chip package having a first surface, a second surface, a lead edge, a first end surface, a second end surface, and a plurality of lead pins extending along the lead edge for connecting to said surface of said substrate, said plurality of lead pins comprising gull-wing zig-zag leads;

forming a thermal carrier device substantially conforming to a surface area of said first surface of said chip package, said thermal carrier device including at least two leads extending therefrom;

connecting portions of the thermal carrier device using an interference fit with portions of said chip package, said thermal carrier device including a pair of insert leads extending therefrom;

adhesively connecting to said first surface of said chip package, thereby providing a heat sink for said chip package, said thermal carrier device including a pair of insert leads extending therefrom; and mounting said thermal carrier device having said chip package connected thereto to said substrate by connecting said pair of insert leads to said surface of said substrate in a substantially vertically orientation.

25. The method of claim 24, wherein the first surface and the second surface of the chip package have substantially the same surface area.

26. The method of claim 24, wherein said thermal carrier device includes a first portion including one of said pair of insert leads and a second portion including another of said pair of insert leads, the first portion and the second portion of said thermal carrier device being located substantially adjacent the first end surface and the second end surface of the chip package.

27. The method of claim 24, wherein said thermal carrier device is comprised of copper.

28. The method of claim 24, wherein said thermal carrier device is comprised of aluminum.

29. The method of claim 24, wherein a portion of said thermal carrier device is coated with a tin/lead alloy metal.

30. The method of claim 24, wherein a portion of said thermal carrier device is coated with a nickeupalladium alloy metal.

31. The method of claim 24, wherein a portion of said thermal carrier device is coated with a nickel/palladium/aluminum metal.

32. The method of claim 24, wherein a portion of said thermal carrier device is coated with a metal for soldering.

33. The method of claim 24, wherein said thermal carrier device has a thickness in a range of about 5 mils to about 12 mils.

34. The method of claim 24, wherein a portion of said chip package includes epoxy.

* * * * *

UNITED STATES PATENT AND TRADEMARK OFFICE
CERTIFICATE OF CORRECTION

PATENT NO. : 6,115,254
DATED : September 5, 2000
INVENTOR(S) : Kinsmann et al.

It is certified that error appears in the above-identified patent and that said Letters Patent is hereby corrected as shown below:

Column 1,
Line 4, change "CROSS REFERENCE" to -- CROSS-REFERENCE --;
Line 62, change "cross section" to -- cross-section --;

Column 3,
Line 12, delete "first";
Line 32, after "type" insert -- package --;

Column 4,
Line 3, after "14" delete ",";
Line 6, after "the" insert -- package --;
Line 34, after "to the" insert -- package --;
Line 37, after "the" insert -- package --; and
Line 47, change "FIG.'s" to -- FIGS. --.

Column 5, claim 10,
Line 47, change "the" to -- a --;

Column 6, claim 20,
Line 36, change "alumninum" to -- aluminum --;

Column 6, claim 22,
Line 42, change "the" to -- a --;

Column 6, claim 24,
Line 66, change "a" to -- said --;

Column 7, claim 24,
Line 4, change "vertically" to -- vertical --; and

UNITED STATES PATENT AND TRADEMARK OFFICE
CERTIFICATE OF CORRECTION

PATENT NO. : 6,115,254
DATED : September 5, 2000
INVENTOR(S) : Kinsmann et al.

It is certified that error appears in the above-identified patent and that said Letters Patent is hereby corrected as shown below:

Column 8, claim 30,
Line 4, change "nickeupalladium" to -- nickel/palladium --.

Signed and Sealed this

Second Day of April, 2002

Attest:

JAMES E. ROGAN
Attesting Officer       Director of the United States Patent and Trademark Office